(12) United States Patent
Lee et al.

(10) Patent No.: US 11,296,366 B2
(45) Date of Patent: Apr. 5, 2022

(54) APPARATUS, METHOD AND BATTERY PACK FOR DETECTING FAULT OF ELECTRICAL CONDUCTOR

(71) Applicant: LG CHEM, LTD., Seoul (KR)

(72) Inventors: Hyun-Chul Lee, Daejeon (KR); Dong-Keun Kwon, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 135 days.

(21) Appl. No.: 16/835,859

(22) Filed: Mar. 31, 2020

(65) Prior Publication Data

US 2020/0350641 A1 Nov. 5, 2020

(30) Foreign Application Priority Data

May 2, 2019 (KR) .................. 10-2019-0051615

(51) Int. Cl.
*H01M 10/48* (2006.01)
*G01R 31/364* (2019.01)
(Continued)

(52) U.S. Cl.
CPC ........ *H01M 10/486* (2013.01); *G01R 31/364* (2019.01); *G01R 31/389* (2019.01);
(Continued)

(58) Field of Classification Search
CPC ......... H01M 2010/4271; H01M 10/48; H01M 2220/20; H01M 10/425; H01M 10/44;
(Continued)

(56) References Cited

U.S. PATENT DOCUMENTS 5,411,537 A * 5/1995 Munshi ................ A61N 1/3708
320/163
6,895,346 B2 * 5/2005 Hamamura ........ G01R 31/2812
438/17
(Continued)

FOREIGN PATENT DOCUMENTS

JP       2007-46942 A     2/2007
JP       2010-223968 A    10/2010
(Continued)

*Primary Examiner* — Helen Rossoshek
(74) *Attorney, Agent, or Firm* — Birch, Stewart, Kolasch & Birch, LLP (57) ABSTRACT

An apparatus, a method and a battery pack for detecting a fault of at least one of first and second electrical conductors connected to a positive terminal and a negative terminal of the battery, respectively. The apparatus includes a current sensor measuring a battery current, a voltage sensor measuring a voltage between the first electrical conductor and the second electrical conductor as a battery voltage, and a control unit. The control unit determines an idle voltage value indicating the battery voltage measured while charging and discharging of the battery is stopped. The control unit determines a diagnosis voltage value indicating the battery voltage measured while the battery is being charged or discharged. The control unit determines whether at least one of the first and second electrical conductors is faulty based on a difference between the idle voltage value and the diagnosis voltage value.

14 Claims, 4 Drawing Sheets

(51) Int. Cl.
*G01R 31/3842* (2019.01)
*G01R 31/389* (2019.01)
*G01R 31/396* (2019.01)
*H01M 50/20* (2021.01)

(52) U.S. Cl.
CPC ....... *G01R 31/3842* (2019.01); *G01R 31/396* (2019.01); *H01M 50/20* (2021.01)

(58) Field of Classification Search
CPC ......... H01M 2010/4278; H01M 50/20; H01M 50/502; H01M 50/543; H01M 50/572; H01M 10/486; H01M 10/4285; H01M 10/482; H01M 4/382; H01M 50/172; H02J 7/0034; Y02E 60/10; G01R 31/364; G01R 31/3842; G01R 31/389; G01R 31/396; G01R 35/00; G01R 31/58
See application file for complete search history.

(56) References Cited

U.S. PATENT DOCUMENTS

| | | | | |
|---|---|---|---|---|
| 7,109,684 | B2* | 9/2006 | Takaoka | H02J 7/0071 320/132 |
| 7,196,492 | B2* | 3/2007 | Sugiura | B60L 58/40 320/101 |
| 7,768,235 | B2* | 8/2010 | Tae | B60L 58/15 320/134 |
| 8,219,333 | B2* | 7/2012 | Li | B60L 58/18 702/63 |
| 8,957,686 | B2* | 2/2015 | Ueda | G01R 31/3835 324/537 |
| 9,026,388 | B2* | 5/2015 | Hirai | H01M 10/3909 702/63 |
| 9,063,201 | B2* | 6/2015 | Rhodin | G01R 31/389 |
| 9,140,761 | B2* | 9/2015 | Ishishita | G01R 19/16542 |
| 9,349,227 | B2* | 5/2016 | Julson | G01R 31/52 |
| 9,738,125 | B1* | 8/2017 | Brickley | B60D 1/26 |
| 10,411,307 | B2* | 9/2019 | Tanaka | H01M 10/48 |
| 2006/0097699 | A1* | 5/2006 | Kamenoff | H02J 7/0048 320/132 |
| 2006/0186890 | A1* | 8/2006 | Iwane | G01R 31/389 324/426 |
| 2009/0208822 | A1* | 8/2009 | Morikawa | H01M 10/482 429/61 |
| 2010/0309949 | A1 | 12/2010 | Akaboshi et al. | |
| 2012/0280692 | A1 | 11/2012 | Park | |
| 2015/0044527 | A1* | 2/2015 | Neudecker | H01M 50/502 429/61 |
| 2016/0111900 | A1* | 4/2016 | Beaston | H02J 7/0014 320/134 |
| 2021/0098998 | A1* | 4/2021 | Eo | G01R 31/3648 |
| 2021/0159792 | A1* | 5/2021 | Andrews | H05K 1/181 |

FOREIGN PATENT DOCUMENTS

| | | | |
|---|---|---|---|
| JP | 4696291 | B2 | 6/2011 |
| JP | 5597349 | B2 | 10/2014 |
| JP | 2015-69964 | A | 4/2015 |
| KR | 10-2012-0080315 | A | 7/2012 |
| KR | 10-2014-0055065 | A | 5/2014 |
| KR | 10-2016-0068522 | A | 6/2016 |
| WO | WO-2004062010 | A1 * | 7/2004 ............ H01M 10/48 |

* cited by examiner

APPARATUS, METHOD AND BATTERY PACK FOR DETECTING FAULT OF ELECTRICAL CONDUCTOR

CROSS-REFERENCE TO RELATED APPLICATION

The present application claims the benefit of Korean Patent Application No. 10-2019-0051615 filed on May 2, 2019 with the Korean Intellectual Property Office, the disclosure of which is incorporated herein by reference in its entirety.

TECHNICAL FIELD

The present disclosure relates to an apparatus, a method and a battery pack for detecting whether coupling state between each terminal of a battery and an electrical conductor is faulty or not.

BACKGROUND ART

Recently, there is dramatically growing demand for portable electronic products such as laptop computers, video cameras and mobile phones, and with the extensive development of electric vehicles, accumulators for energy storage, robots and satellites, many studies are being made on high performance batteries that can be recharged repeatedly.

Currently, commercially available batteries include nickel-cadmium batteries, nickel-hydrogen batteries, nickel-zinc batteries, lithium batteries and the like, and among them, lithium batteries have little or no memory effect, and thus they are gaining more attention than nickel-based batteries for their advantages that recharging can be done whenever it is convenient, the self-discharge rate is very low and the energy density is high.

Recently, to provide high voltage, there is an increasing demand for a battery pack including two or more batteries connected in series through an electrically conductor (e.g., a bus-bar).

However, the coupling state between the battery and the electrical conductor may become faulty due to external impacts and degradation of the electrical conductor. For example, when damage (e.g., cracks) may occur in the electrical conductor or the contact area between the electrical conductor and the battery terminal decreases, the contact resistance increases at the region of contact between the electrical conductor and the battery terminal. As a consequence, a larger amount of heat may be generated from the electrical conductor, and in worse cases, the electrical conductor may be broken and charging and discharging of the battery module may be stopped.

There is a prior art that determines an abnormality in the bus-bar based on voltage across the bus-bar used as the electrical conductor (Patent Literature 1).

However, the prior art requires a voltage sensor for measuring the voltage of the battery as well as an additional voltage sensor for measuring the voltage across the bus-bar.

(Patent Literature 1) Korean Patent Publication No. 10-2012-0080315 (published on Jul. 17, 2012)

DISCLOSURE

Technical Problem

The present disclosure is designed to solve the above-described problem, and therefore the present disclosure is directed to providing an apparatus, a method and a battery pack for detecting whether at least one of two electrical conductors individually coupled to positive and negative terminals of a battery is faulty based on a voltage change between the two electrical conductors, generated before and after when an electric current flows through the battery.

These and other objects and advantages of the present disclosure may be understood by the following description and will be apparent from the embodiments of the present disclosure. In addition, it will be readily understood that the objects and advantages of the present disclosure may be realized by the means set forth in the appended claims and a combination thereof.

Technical Solution

An apparatus according to an aspect of the present disclosure is for detecting a fault of at least one of a first electrical conductor connected to a positive terminal of a battery and a second electrical conductor connected to a negative terminal of the battery. The apparatus includes a current sensor configured to measure an electric current flowing through the battery, the electric current being a battery current of the battery, a voltage sensor configured to measure a voltage between the first electrical conductor and the second electrical conductor, the voltage being a battery voltage of the battery, and a control unit operably coupled to the current sensor and the voltage sensor. The control unit is configured to determine an idle voltage value indicating the battery voltage measured at a first time point while charging and discharging of the battery is stopped. The control unit is configured to determine a diagnosis voltage value indicating the battery voltage measured at a second time point while the battery is being charged or discharged. The control unit is configured to determine whether at least one of the first electrical conductor and the second electrical conductor is faulty based on a difference between the idle voltage value and the diagnosis voltage value.

The control unit may be configured to determine that at least one of the first electrical conductor and the second electrical conductor is faulty when an absolute value of the difference between the idle voltage value and the diagnosis voltage value is larger than a threshold voltage value.

The control unit may be configured to determine a diagnosis current value indicating the battery current measured at the second time point. The control unit may be configured to determine the threshold voltage value based on a reference resistance, an internal resistance of the battery and the diagnosis current value. The reference resistance may indicate (or may be) a sum of a first contact resistance between the first electrical conductor and the positive terminal and a second contact resistance between the second electrical conductor and the negative terminal when both the first electrical conductor and the second electrical conductor are fault-free.

The control unit may be configured to determine the threshold voltage value using the following Equation 1:

$$\Delta V_{th} = \{|I_{dig}| \times (R_{node} + R_{int})\} \times \alpha \qquad \text{[Equation 1]}$$

In the above Equation 1, $I_{dig}$ denotes the diagnosis current value, $R_{node}$ denotes the reference resistance, $R_{int}$ denotes the internal resistance of the battery, $\alpha$ denotes a predetermined error ratio, and $\Delta V_{th}$ denotes the threshold voltage value.

The apparatus may further include a temperature sensor configured to measure a temperature of the battery. The control unit may further be configured to determine the threshold voltage value further based on a temperature value of the battery measured by the temperature sensor at the second time point.

The control unit may be configured to obtain a resistance change ratio corresponding to the temperature value from a data table in which a correlation between temperature and resistance change ratio of each electrical conductor is recorded. The control unit may be configured to determine the threshold voltage value using the following Equation 2:

$$\Delta V_{th} = \{|I_{dig}| \times \{(R_{node} \times C_1) + R_{int}\}\} \times \alpha \quad \text{[Equation 2]}$$

In the above Equation 2, $I_{dig}$ denotes the diagnosis current value, $R_{node}$ denotes the reference resistance, $R_{int}$ denotes the internal resistance of the battery, $C_1$ denotes the resistance change ratio, $\alpha$ denotes a predetermined error ratio, and $\Delta V_{th}$ denotes the threshold voltage value.

The control unit may be configured to determine the internal resistance of the battery based on a history of the battery current.

The control unit may be configured to output a fault message when at least one of the first electrical conductor and the second electrical conductor is determined to be faulty.

A battery pack according to another aspect of the present disclosure includes the apparatus.

A method according to still another aspect of the present disclosure is for detecting a fault of at least one a first electrical conductor connected to a positive terminal of a battery and a second electrical conductor connected to a negative terminal of the battery using the apparatus. The method includes determining, via the control unit, an idle voltage value indicating a battery voltage measured by the current sensor at a first time point, determining, via the control unit, a diagnosis voltage value indicating a battery voltage measured by the voltage sensor at the second time point, and determining, via the control unit, whether at least one of the first electrical conductor and the second electrical conductor is faulty based on a difference between the idle voltage value and the diagnosis voltage value.

Advantageous Effects

According to at least one of the embodiments of the present disclosure, it is possible to detect whether at least one of two electrical conductors individually coupled to positive and negative terminals of a battery is faulty based on a voltage change between the two electrical conductors, generated before and after when an electric current flows through the battery. That is, there is no need for an additional voltage sensor to measure the voltage across each electrical conductor.

In addition, according to at least one of the embodiments of the present disclosure, a fault of the electrical conductor is detected based on the internal resistance of the battery associated with the level of degradation of the battery, thereby reducing the error that the electrical conductor is incorrectly detected as being faulty even though it is actually not faulty.

The effects of the present disclosure are not limited to the effects mentioned above, and these and other effects will be clearly understood by those skilled in the art from the appended claims.

BRIEF DESCRIPTION OF DRAWINGS

The accompanying drawings illustrate a preferred embodiment of the present disclosure, and together with the detailed description of the present disclosure described below, serve to provide a further understanding of the technical aspects of the present disclosure, and thus the present disclosure should not be construed as being limited to the drawings.

BEST MODE

Hereinafter, the preferred embodiments of the present disclosure will be described in detail with reference to the accompanying drawings. Prior to the description, it should be understood that the terms or words used in the specification and the appended claims should not be construed as being limited to general and dictionary meanings, but interpreted based on the meanings and concepts corresponding to the technical aspects of the present disclosure on the basis of the principle that the inventor is allowed to define the terms appropriately for the best explanation.

Therefore, the embodiments described herein and illustrations shown in the drawings are just a most preferred embodiment of the present disclosure, but not intended to fully describe the technical aspects of the present disclosure, so it should be understood that a variety of other equivalents and modifications could be made thereto at the time of filing the application.

The terms including the ordinal number such as "first", "second" and the like, are used to distinguish one element from another among various elements, but not intended to limit the elements by the terms.

Unless the context clearly indicates otherwise, it will be understood that the term "comprises" or "includes" when used in this specification, specifies the presence of stated elements, but does not preclude the presence or addition of one or more other elements. Additionally, the term <control unit> as used herein refers to a processing unit of at least one function or operation, and this may be implemented in hardware or software alone or in combination.

In addition, throughout the specification, it will be further understood that when an element is referred to as being "connected to" another element, it can be directly connected to the other element or intervening elements may be present.

Figure 1:
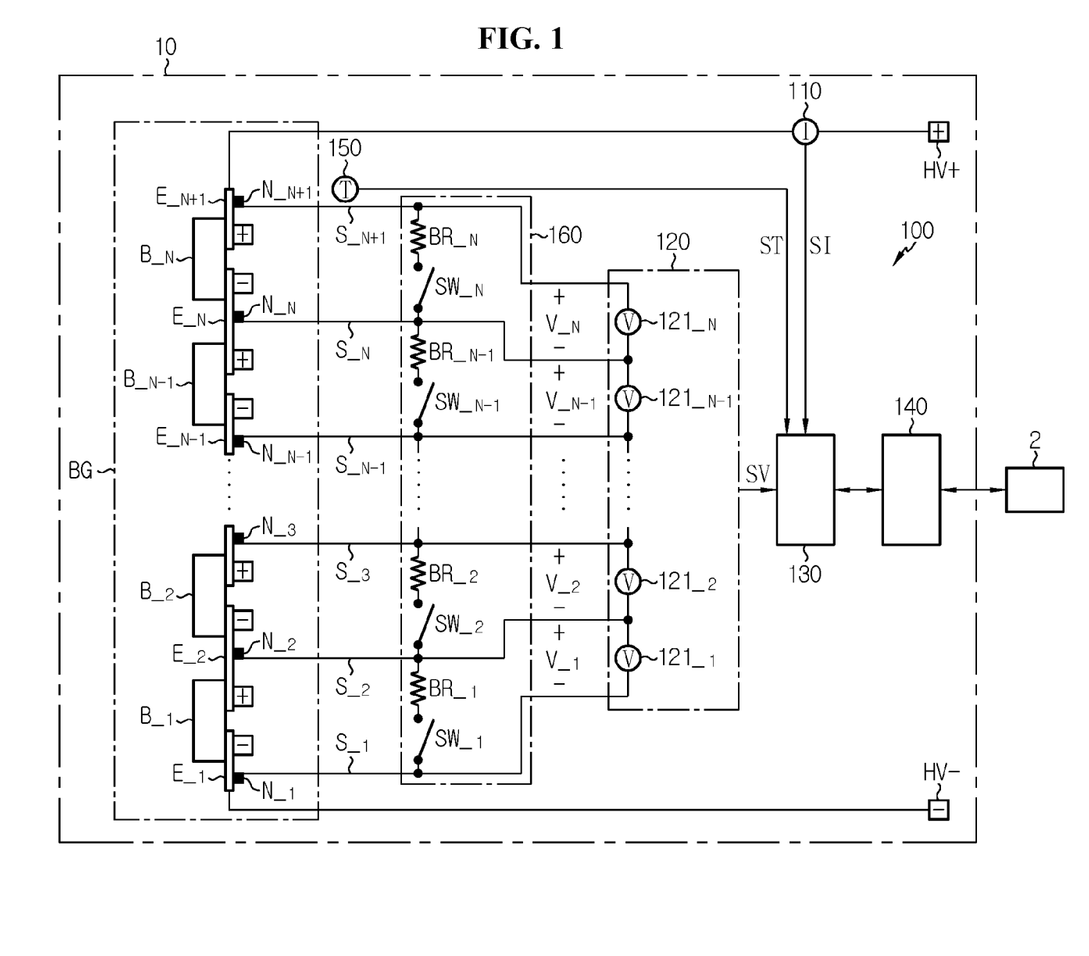
FIG. 1 is an exemplary configuration diagram of a battery pack according to an embodiment of the present disclosure.

FIG. 1 is an exemplary configuration diagram of a battery pack 10 according to an embodiment of the present disclosure.

Referring to FIG. 1, the battery pack 10 includes a battery group BG and an apparatus 100. The battery pack 10 may be mounted in an electrical power system 1 such as an electric vehicle to supply power required for the operation of the electrical power system 1.

The battery group BG includes a plurality of batteries $B_1 \sim B_N$ (N is a natural number of 2 or greater) and a plurality of electrical conductors $E_1 \sim E_{N+1}$.

Each of the plurality of batteries $B_1 \sim B_N$ includes at least one unit cell. The unit cell may be, for example, a lithium ion cell. When at least one of the plurality of batteries $B_1 \sim B_N$ includes a plurality of unit cells, the plurality of unit cells may be electrically connected in series or in parallel.

Each of the plurality of electrical conductors $E_{\_1} \sim E_{\_N+1}$ has a first end and a second end. For example, a bus-bar may be used as the plurality of electrical conductors $E_{\_1} \sim E_{\_N+1}$.

The plurality of batteries $B_{\_1} \sim B_{\_N}$ is electrically and physically connected in series between a first power terminal HV+ and a second power terminal HV− of the battery pack 10 through the plurality of electrical conductors $E_{\_1} \sim E_{\_N+1}$.

When i=1~N, a negative terminal of the battery $B_{\_i}$ and the second end of the electrical conductor $E_{\_i}$ are coupled and fixed by bolting, soldering or welding, and a positive terminal of the battery $B_{\_i}$ and the first end of the electrical conductor $E_{\_i+1}$ are coupled and fixed by bolting, soldering or welding.

That is, the battery $B_{\_i}$ is connected between a pair of adjacent electrical conductors $E_{\_i}$, $E_{\_i+1}$.

The second end of the electrical conductor $E_{\_N+1}$ is electrically connected to the first power terminal HV+ through a power cable, etc. The first end of the electrical conductor $E_{\_1}$ is electrically connected to the second power terminal HV− through a power cable, etc.

The apparatus 100 is provided to determine whether at least one of the plurality of electrical conductors $E_{\_1} \sim E_{\_N+1}$ is faulty. The apparatus 100 includes a current sensor 110, a voltage measuring unit 120 and a control unit 130. The apparatus 100 may further include at least one of an interface unit 140, a temperature sensor 150 and a balancing circuit 160.

The current sensor 110 is provided to measure a battery current. The battery current refers to an electric current that flows through the plurality of batteries $B_{\_1} \sim B_{\_N}$ and the plurality of electrical conductors $E_{\_1} \sim E_{\_N+1}$ while the plurality of batteries $B_{\_1} \sim B_{\_N}$ is being charged, discharged or idling. The current sensor 110 may be installed on an electric current line connecting the first power terminal HV+ and the second end of the electrical conductor $E_{\_N+1}$ or an electric current line connecting the second power terminal HV− and the first end of the electrical conductor $E_{\_1}$. The current sensor 110 may include, for example, a shunt resistor and/or a hall effect device. The current sensor 110 may be configured to measure the battery current per unit time (e.g., 0.01 sec) and generate a current notification signal SI indicating the measured battery current.

The temperature sensor 150 is provided to measure a temperature of the battery group BG. The temperature of the battery group BG may result from a combination of heat generated from the plurality of batteries $B_{\_1} \sim B_{\_N}$, heat generated from the plurality of electrical conductors $E_{\_1} \sim E_{\_N+1}$ and outdoor temperature. For example, a thermocouple may be used as the temperature sensor 150. The temperature sensor 150 is configured to measure the temperature of the battery group BG per unit time, and generate a temperature notification signal ST indicating the measured temperature.

The voltage measuring unit 120 is provided to measure a voltage (hereinafter referred to as 'battery voltage') of each of the plurality of batteries $B_{\_1} \sim B_{\_N}$.

The voltage measuring unit 120 is electrically connected to the plurality of electrical conductors $E_{\_1} \sim E_{\_N+1}$ through a plurality of sensing lines $S_{\_1} \sim S_{\_N+1}$, respectively. Each of the plurality of sensing lines $S_{\_1} \sim S_{\_N+1}$ has a first end and a second end.

The voltage measuring unit 120 may include a plurality of voltage sensors $121_{\_1} \sim 121_{\_N}$. The first end of the sensing line $S_{\_1}$ is electrically connected to a sensing node $N_{\_i}$ of the electrical conductor $E_{\_i}$. The second end of the sensing line $S_{\_1}$ may be electrically connected to the voltage sensor $121_{\_1}$, and the second end of the sensing line $S_{\_N+1}$ may be electrically connected to the voltage sensor $121_{\_N}$. When N≥i>1, the second end of the sensing line $S_{\_i}$ may be electrically connected to a connecting node between the voltage sensor $121_{\_i-1}$ and the voltage sensor $121_{\_i}$. The sensing node $N_{\_i}$ may be a predetermined area (e.g., an area including the center) of the electrical conductor $E_{\_i}$ for electrical and physical connection with the sensing line $S_{\_i}$. The sensing node $N_{\_N+1}$ may be a predetermined area (e.g., an area including the center) of the electrical conductor $E_{\_N+1}$ for electrical and mechanical connection with the sensing line $S_{\_N+1}$.

The voltage sensor $121_{\_i}$ may be configured to measure a voltage between the second end of the sensing line $S_{\_i}$ and the second end of the sensing line $S_{\_i+1}$ as the battery voltage $V_{\_i}$ of the battery $B_{\_i}$ per unit time. Through this, the voltage measuring unit 120 may simultaneously or successively measure the battery voltage of each of the plurality of batteries $B_{\_1} \sim B_{\_N}$ per unit time. The voltage measuring unit 120 may be configured to generate a voltage notification signal SV indicating the battery voltage $V_{\_i}$.

The interface unit 140 is configured to support wired or wireless communication between the control unit 130 and a high-level controller 2 (e.g., Electronic Control Unit (ECU)) of the electrically powered system 1. The wired communication may be, for example, controller area network (CAN) communication, and the wireless communication may be, for example, Zigbee or Bluetooth communication. Of course, the communication protocol is not limited to a particular type and may include any type of communication protocol that supports the wired and wireless communication between the control unit 130 and the high-level controller. The interface unit 140 may include an output device such as a display or a speaker to provide information corresponding to a message from the control unit 130 in a form that can be recognized by a user.

The balancing circuit 160 includes a plurality of balancing resistors $BR_{\_1} \sim BR_{\_N}$ and a plurality of balancing switches $SW_{\_1} \sim SW_{\_N}$. A series circuit of the balancing resistor $B_{\_i}$ and the balancing switch $S_{\_i}$ is electrically connected in parallel to the battery $B_{\_i}$ through the two sensing lines $S_{\_i} \sim S_{\_i+1}$. The control unit 130 is configured to perform control to selectively turn on/off at least one of the plurality of balancing switches $SW_{\_1} \sim SW_{\_N}$ for State Of Charge (SOC) balancing of the plurality of batteries $B_{\_1} \sim B_{\_N}$. For example, when the battery voltage $V_{\_1}$ of the battery $B_{\_1}$ is higher than the average battery voltage, the control unit 130 may turn on the balancing switch $SW_{\_1}$ and turn off the remaining balancing switches $SW_{\_2} \sim SW_{\_N}$.

The control unit 130 may be operably coupled to the current sensor 110, the voltage measuring unit 120, the interface unit 140, the temperature sensor 150 and the balancing circuit 160. The control unit 130 may collect the current notification signal SI, the voltage notification signal SV and the temperature notification signal ST per unit time.

The control unit 130 may be implemented in hardware using at least one of application specific integrated circuits (ASICs), digital signal processors (DSPs), digital signal processing devices (DSPDs), programmable logic devices (PLDs), field programmable gate arrays (FPGAs), microprocessors and electrical units for performing other functions. The control unit 130 may have a memory device embedded therein, and the memory device may include, for example, RAM, ROM, register, hard disk, optical recording media or magnetic recording media. The memory device may store, update and/or erase programs including various types of control logics that are executed by the control unit 130, and/or data created when the control logics are executed.

The control unit 130 may determine an idle voltage value indicating the battery voltage $V_j$ measured at a first time point in which the battery $B_j$ is in an idle state. The idle voltage value may be, for example, Open Circuit Voltage (OCV) of the battery $B_j$. The idle state may be referred to as 'no-load condition' or 'calender state', and in such a state, the battery current does not flow (i.e., the battery current=0A) and charging and discharging of the battery $B_j$ is stopped. The battery $B_j$ in the idle state may represent that the battery group BG is in the idle state.

The control unit 130 may determine a diagnosis voltage value indicating the battery voltage $V_j$ measured at a second time point in which the battery $B_j$ is in a cycle state. The cycle state is the opposite to the idle state and may be referred to as 'load condition', and when in the cycle state, the battery current flows and the battery $B_j$ is charged or discharged. The control unit 130 may be further configured to determine a diagnosis current value indicating the battery current measured at the second time point. A difference between the first time point and the second time point may be within a predetermined time interval (e.g., 0.05 sec). For example, one of the first time point and the second time point may be a time point at which the unit time has passed from the other. Hereinafter, it is assumed that a current value indicating the battery current measured while the battery $B_j$ is being charged is determined as a positive value, and a current value indicating the battery current measured while the battery $B_j$ is being discharged is determined as a negative value.

The control unit 130 is configured to determine whether at least one of the electrical conductor $E_j$ and the electrical conductor $E_{j+1}$ is faulty based on a difference between the idle voltage value and the diagnosis voltage value associated with the battery $B_j$.

Figure 2:
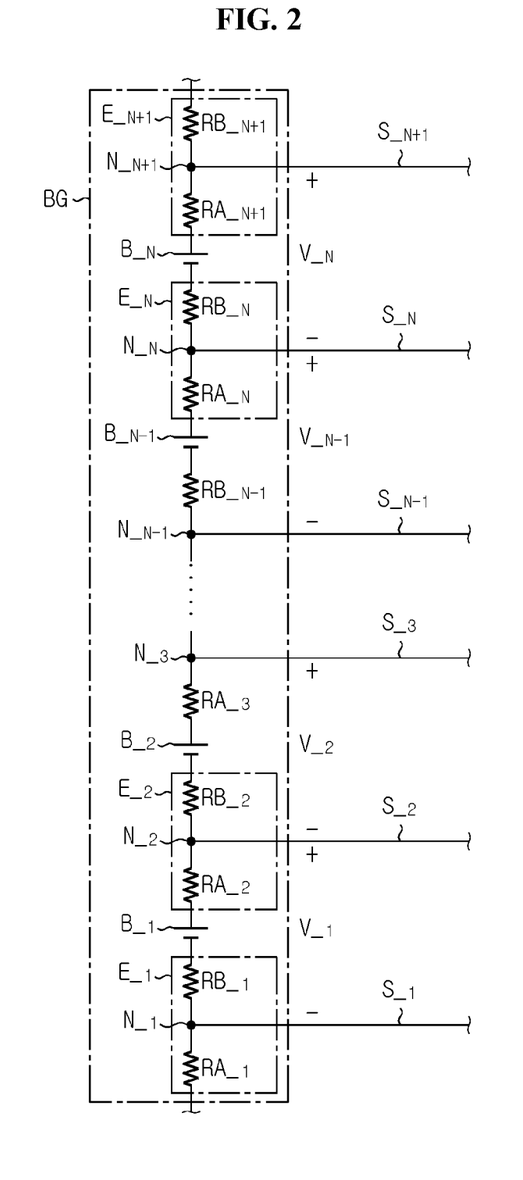
FIG. 2 is an exemplary diagram of an equivalent circuit of a battery group shown in FIG. 1.

FIG. 2 is an exemplary diagram of an equivalent circuit of the battery group BG shown in FIG. 1.

Referring to FIGS. 1 and 2, the electrical conductor $E_j$ may be equated to a series circuit of a resistor $RA_j$ and a resistor $RB_j$. The electrical conductor $E_{N+1}$ may be equated to a series circuit of a resistor $RA_{N+1}$ and a resistor $RB_{N+1}$. One end of the resistor $RA_j$ and one end of the resistor $RB_j$ are electrically connected in common to the sensing node $N_j$. One end of the resistor $RA_{N+1}$ and one end of the resistor $RB_{N+1}$ are electrically connected in common to the sensing node $N_{N+1}$. The other end of the resistor $RB_j$ is electrically connected to the negative terminal of the battery $B_j$. The other end of the resistor $RA_{i+i}$ is electrically connected to the positive terminal of the battery $B_j$.

The resistance of the resistor $RB_j$ indicates a contact resistance between the second end of the electrical conductor $E_j$ and the negative terminal of the battery $B_j$. The resistance of the resistor $RA_{j+1}$ indicates a contact resistance between the first end of the electrical conductor $E_{j+1}$ and the positive terminal of the battery $B_j$. Accordingly, the battery voltage $V_j$ includes a voltage across the battery $B_j$, a voltage across the resistor $R_j$ and a voltage across the resistor $RA_{j+1}$.

In relation to the battery $B_j$, it may be said that the electrical conductor $E_j$ is faulty when the resistance of the resistor $R_j$ exceeds a predetermined value due to the loosened coupling state between the second end of the electrical conductor $E_j$ and the negative terminal of the battery $B_j$, or deterioration of the electrical conductor $E_j$, etc.

In relation to the battery $B_j$, it may be said that the electrical conductor $E_j$ is faulty when the resistance of the resistor $RA_{i+1}$ exceeds a predetermined value due to the loosened coupling state between the first end of the electrical conductor $E_{j+1}$ and the positive terminal of the battery $B_j$, or deterioration of the electrical conductor $E_{j+1}$, etc.

When the absolute value of the difference between the idle voltage value and the diagnosis voltage value associated with the battery $B_j$ is larger than the threshold voltage value, the control unit 130 may determine that at least one of the electrical conductor $E_j$ and the electrical conductor $E_{j+1}$ is faulty. On the contrary, when the absolute value of the difference between the idle voltage value and the diagnosis voltage value associated with the battery $B_j$ is equal to or less than the threshold voltage value, the control unit 130 may determine that both the electrical conductor $E_j$ and the electrical conductor $E_{j+1}$ are fault-free (i.e. non-faulty state).

The threshold voltage value may be a predetermined constant value.

Alternatively, the threshold voltage value is a variable that depends on the battery current and the internal resistance of the battery, and may be updated by the control unit 130. Hereinafter, processing for determining the threshold voltage value as the variable will be described in more detail.

The control unit 130 determines the threshold voltage value for the battery $B_j$ based on a reference resistance, the internal resistance of the battery $B_j$ and the diagnosis current value. The reference resistance for the battery $B_j$ indicates the sum of the resistance of the resistor $RB_j$ and the resistance of the resistor $RA_{j+1}$ at a reference temperature (e.g., 20° C.) when both the electrical conductor $E_j$ and the electrical conductor $E_{+1}$ are fault-free. The reference resistance may change depending on the characteristics (e.g., material, shape and size) of the electrical conductor and a coupling type (e.g., soldering, bolting, welding) between the electrical conductor and the battery. The reference resistance may be preset based on the resistance test results of the electrical conductor.

The control unit 130 may determine the threshold voltage value using the following Equation 1:

$$\Delta V_{th} = \{|I_{dig}| \times (R_{node} + R_{int})\} \times \alpha \qquad \text{[Equation 1]}$$

In Equation 1, $I_{dig}$ denotes the diagnosis current value, $R_{node}$ denotes the reference resistance, $R_{int}$ denotes the internal resistance of the battery $B_j$, $\alpha$ denotes a predetermined error ratio, and $\Delta V_{th}$ denotes the threshold voltage value. The predetermined error ratio $\alpha$ is a value that is preset to be greater than 1, to take into account a measurement error of each of the current sensor 110 and/or the voltage measuring unit 120 when determining the threshold voltage value. Alternatively, 1 may replace the predetermined error ratio $\alpha$.

The internal resistance of the battery $B_j$ is a parameter indicating the level of degradation of the battery $B_j$, and tends to gradually increase as the battery $B_j$ degrades. The internal resistance of the battery $B_j$ may be determined by the control unit 130 at an earlier time point than the first time point or the second time point. In an example, the control unit 130 may determine the internal resistance of the battery $B_j$ at a specific time point based on a period of time from the time point at which the battery $B_j$ was manufactured to the specific time point. In another example, the control unit 130 may determine the internal resistance of the battery $B_j$ at a specific time point based on a history of the battery current from the time point at which the battery $B_j$ was manufactured to the specific time point. The history of the battery current may be a set of data indicating time-sequential changes of the battery current of the battery $B_j$. Of course, the internal resistance of the battery $B_j$ may be determined using a variety of known techniques.

The control unit 130 may determine the threshold voltage value based on the reference resistance and the internal resistance of the battery $B_j$, the diagnosis current value and the temperature value. The temperature value may indicate a temperature measured by the temperature sensor 150 at the first time point or the second time point.

The control unit 130 obtains a resistance change ratio corresponding to the temperature value from a data table in which a correlation between a temperature and a resistance change ratio of the electrical conductor is recorded. The electrical conductor may have an unique characteristic that the resistance increases with the increasing temperature. When the temperature value is equal to the reference temperature (e.g., 20° C.), the resistance change ratio obtained from the data table may be 1. When the temperature value is higher than the reference temperature, the resistance change ratio obtained from the data table may be larger than 1. When the temperature value is lower than the reference temperature, the resistance change ratio obtained from the data table may be smaller than 1.

The control unit 130 may determine the threshold voltage value using the following Equation 2.

$$\Delta V_{th} = \{|I_{dig}| \times \{(R_{node} \times C_1) + R_{int}\}\} \times \alpha \quad \text{[Equation 2]}$$

In Equation 2, $C_1$ denotes the resistance change ratio. The remaining factors of Equation 2, $I_{dig}$, $R_{node}$, $R_{int}$, $\alpha$, $\Delta V_{th}$, are equal to those of Equation 1.

Figure 3:
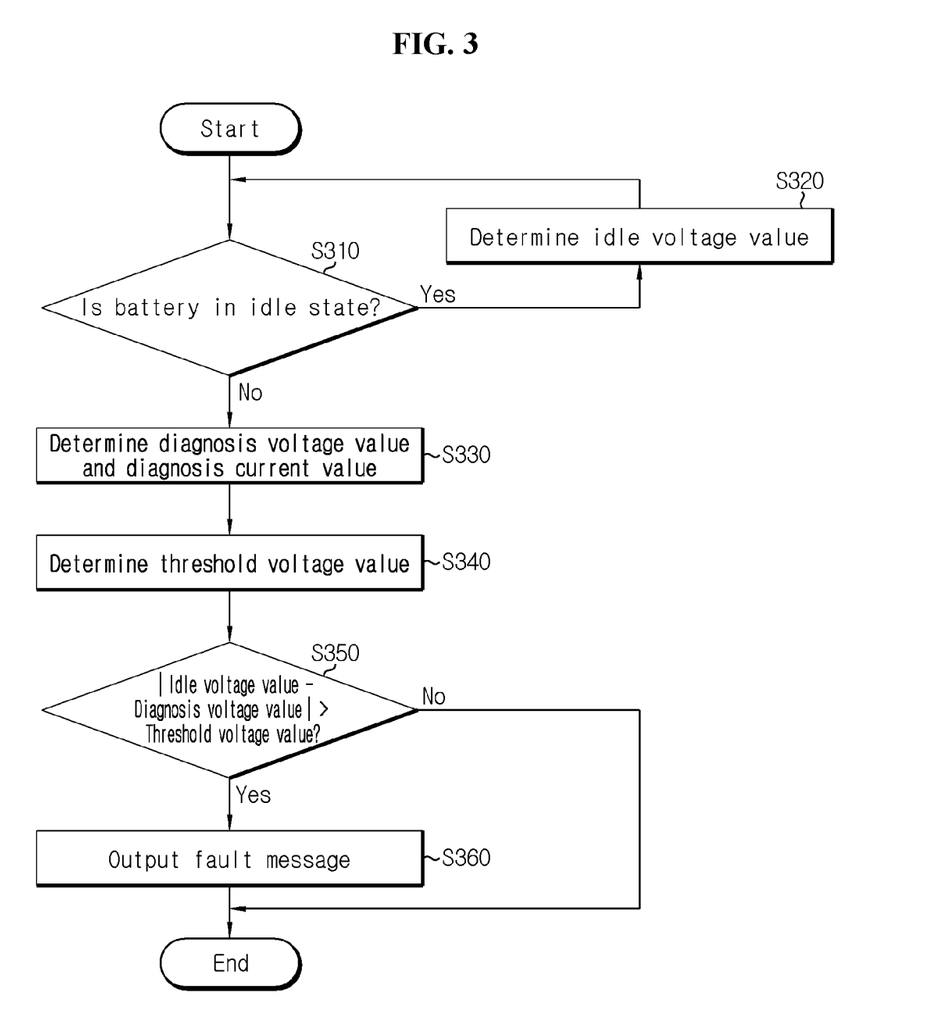
FIG. 3 is an exemplary flowchart of a method for detecting a fault of an electrical conductor according to another embodiment of the present disclosure.

FIG. 3 is an exemplary flowchart of a method for detecting a fault of an electrical conductor according to another embodiment of the present disclosure.

Referring to FIGS. 1 to 3, in step S310, the control unit 130 determines whether the battery $B_j$ is in the idle state. For example, when the battery current indicated by the current notification signal SI is equal to 0A, a result value of the step S310 is "YES". When the result value of the step S310 is "YES", step S320 is performed. The result value of step S320 being "NO" indicates that the battery $B_j$ is in the cycle state. When the value of the step S320 is "NO", step S330 may be performed.

In step S320, the control unit 130 determines the idle voltage value indicating the battery voltage of the battery $B_j$ measured at the first time point in which the battery $B_j$ is in the idle state.

In step S330, the control unit 130 determines the diagnosis voltage value indicating the battery voltage of the battery $B_j$ measured at the second time point in which the battery $B_j$ is in the cycle state and the diagnosis current value indicating the battery current of the battery $B_j$ measured at the second time point.

In step S340, the control unit 130 determines the threshold voltage value. The above Equation 1 may be used to determine the threshold voltage value.

In step S350, the control unit 130 determines whether the absolute value of the difference between the idle voltage value and the diagnosis voltage value is larger than the threshold voltage value. When a result value of the step S350 is "YES", step S360 is performed. When the result value of the step S350 is "NO", the method may end.

In step S360, the control unit 130 outputs a fault message to the interface unit 140. The fault message indicates that al least one of the coupling state between the battery $B_j$ and the electrical conductor $E_j$ and the coupling state between the battery $B_j$ and the electrical conductor $E_{j+1}$ is faulty.

The interface unit 140 may output information corresponding to the fault message visually and/or audibly, or transmit a warning signal corresponding to the fault message to an external device, in response to the fault message.

Figure 4:
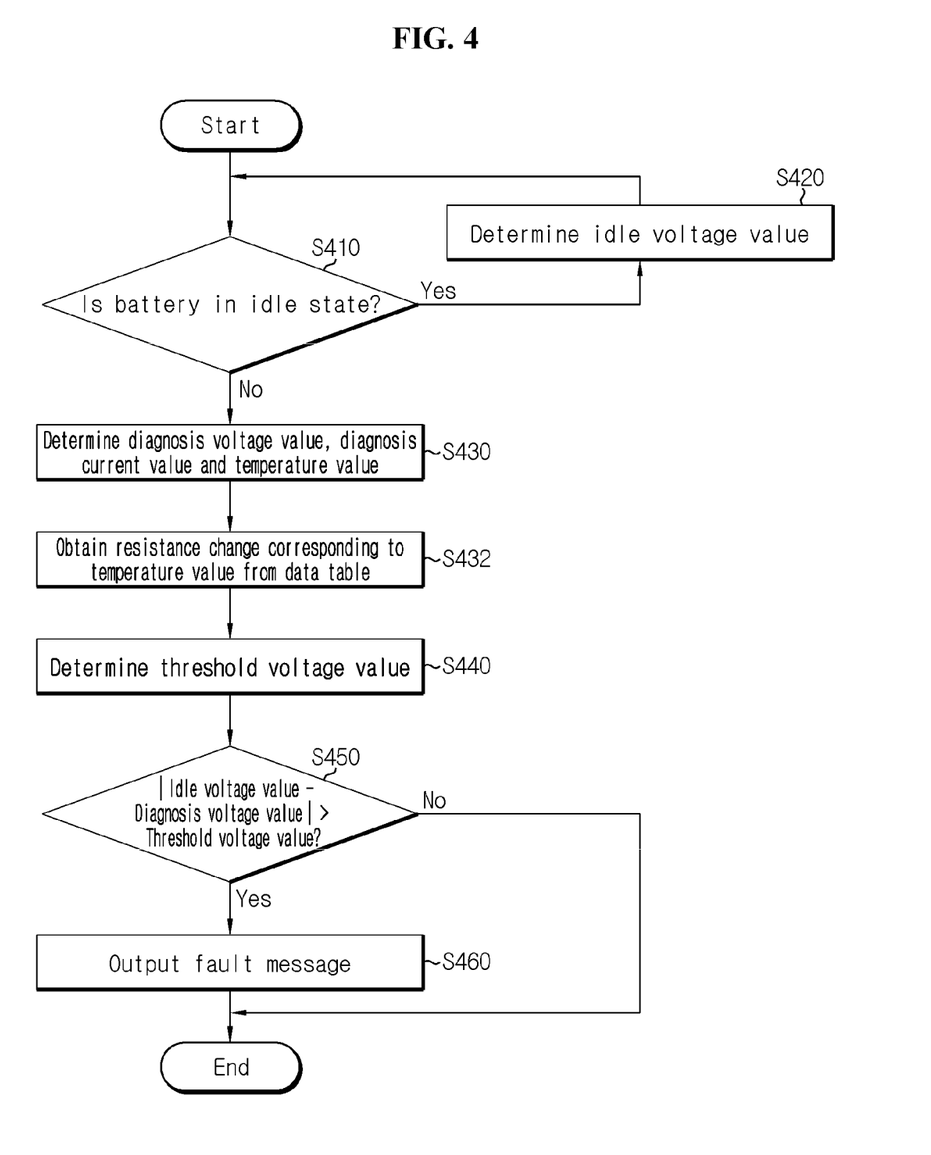
FIG. 4 is an exemplary flowchart of a method for detecting a fault of an electrical conductor according to still another embodiment of the present disclosure.

FIG. 4 is an exemplary flowchart of a method for detecting a fault of an electrical conductor according to still another embodiment of the present disclosure.

Referring to FIGS. 1, 2 and 4, in step S410, the control unit 130 determines whether the battery $B_j$ is in the idle state. When a result value of the step S410 is "YES", step S420 is performed. When the result value of the step S420 is "NO", step S430 may be performed.

In step S420, the control unit 130 determines the idle voltage value indicating the battery voltage of the battery $B_j$ measured at the first time point in which the battery $B_j$ is in the idle state.

In step S430, the control unit 130 determines the diagnosis voltage value indicating the battery voltage of the battery $B_j$, the diagnosis current value indicating the battery current of the battery $B_j$ and the temperature value indicating the temperature of the battery $B_j$, measured at the second time point in which the battery $B_j$ is in the cycle state.

In step S432, the control unit 130 obtains the resistance change ratio corresponding to the temperature value from the data table in which the correlation between the temperature and the resistance change ratio of the electrical conductor is recorded.

In step S440, the control unit 130 determines the threshold voltage value. The above Equation 2 may be used to determine the threshold voltage value.

In step S450, the control unit 130 determines whether the absolute value of the difference between the idle voltage value and the diagnosis voltage value is larger than the threshold voltage value. When a result value of the step S450 is "YES", step S460 is performed. When the result value of the step S450 is "NO", the method may end.

In step S460, the control unit 130 outputs a fault message to the interface unit 140. The fault message indicates that at least one of the coupling state between the battery $B_j$ and the electrical conductor $E_j$ and the coupling state between the battery $B_j$ and the electrical conductor $E_{j+1}$ is faulty.

The embodiments of the present disclosure described hereinabove are not implemented only through the apparatus and method, and may be implemented through programs that perform functions corresponding to the configurations of the embodiments of the present disclosure or recording media having the programs recorded thereon, and such implementation may be easily achieved by those skilled in the art from the disclosure of the embodiments previously described.

While the present disclosure has been hereinabove described with regard to a limited number of embodiments and drawings, the present disclosure is not limited thereto and it is obvious to those skilled in the art that various modifications and changes may be made thereto within the technical aspects of the present disclosure and the equivalent scope of the appended claims.

Additionally, as many substitutions, modifications and changes may be made to the present disclosure described hereinabove by those skilled in the art without departing from the technical aspects of the present disclosure, the present disclosure is not limited by the above-described embodiments and the accompanying drawings, and some or all of the embodiments may be selectively combined to allow various modifications.

What is claimed is:

1. An apparatus for detecting a fault of at least one of a first electrical conductor connected to a positive terminal of a battery and a second electrical conductor connected to a negative terminal of the battery, the apparatus comprising:
a current sensor configured to measure an electric current flowing through the battery, the electric current being a battery current of the battery;
a voltage sensor configured to measure a voltage between the first electrical conductor and the second electrical conductor, the voltage being a battery voltage of the battery; and
a control unit operably coupled to the current sensor and the voltage sensor,
wherein the control unit is configured to:
determine an idle voltage value indicating the battery voltage measured at a first time point while charging and discharging of the battery is stopped, and
determine a diagnosis voltage value indicating the battery voltage measured at a second time point while the battery is being charged or discharged, and
determine whether at least one of the first electrical conductor and the second electrical conductor is faulty based on a difference between the idle voltage value and the diagnosis voltage value,
wherein the control unit is further configured to:
determine a diagnosis current value indicating the battery current measured at the second time point, and
determine the threshold voltage value based on a reference resistance, an internal resistance of the battery and the diagnosis current value,
wherein the reference resistance is a sum of a first contact resistance between the first electrical conductor and the positive terminal and a second contact resistance between the second electrical conductor and the negative terminal when both the first electrical conductor and the second electrical conductor are fault-free,
wherein the control unit is configured to determine the threshold voltage value using the following Equation 1:

$$\Delta V_{th} = \{|I_{dig}| \times (R_{node} = R_{int})\} \times \alpha, \quad (1)$$

and
wherein $I_{dig}$ denotes the diagnosis current value, $R_{node}$ denotes the reference resistance, $R_{int}$ denotes the internal resistance of the battery, $\alpha$ denotes a predetermined error ratio, and $\Delta v_{th}$ denotes the threshold voltage value.

2. The apparatus according to claim 1, wherein the control unit is further configured to determine that at least one of the first electrical conductor and the second electrical conductor is faulty when an absolute value of the difference between the idle voltage value and the diagnosis voltage value is larger than a threshold voltage value.

3. The apparatus according to claim 1, further comprising:
a temperature sensor configured to measure a temperature of the battery,
wherein the control unit is further configured to determine the threshold voltage value further based on a temperature value of the battery measured by the temperature sensor at the second time point.

4. The apparatus according to claim 3, wherein the control unit is further configured to:
obtain a resistance change ratio corresponding to the temperature value from a data table in which a correlation between temperature and resistance change ratio is recorded, and
determine the threshold voltage value using the following Equation 2:

$$\Delta V_{th} = \{|I_{dig}| \times \{(R_{node} \times C_1) = R_{int}\}\} \times \alpha \quad (2)$$

wherein $I_{dig}$ denotes the diagnosis current value, $R_{node}$ denotes the reference resistance, $R_{int}$ denotes the internal resistance of the battery, $C_1$ denotes the resistance change ratio, $\alpha$ denotes a predetermined error ratio, and $\Delta V_{th}$ denotes the threshold voltage value.

5. The apparatus according to claim 1, wherein the control unit is further configured to determine the internal resistance of the battery based on a history of the battery current.

6. The apparatus according to claim 1, wherein the control unit is further configured to output a fault message when at least one of the first electrical conductor and the second electrical conductor is determined to be faulty.

7. A battery pack comprising the apparatus according to claim 1.

8. An electrical system comprising the battery pack according to claim 7.

9. A method for detecting a fault of at least one of a first electrical conductor connected to a positive terminal of a battery and a second electrical conductor connected to a negative terminal of the battery using the apparatus according to claim 1, the method comprising:
determining, via the control unit, an idle voltage value indicating a battery voltage measured by the current sensor at a first time point;
determining, via the control unit, a diagnosis voltage value indicating a battery voltage measured by the voltage sensor at a second time point; and
determining, via the control unit, whether at least one of the first electrical conductor and the second electrical conductor is faulty based on a difference between the idle voltage value and the diagnosis voltage value,
determining a diagnosis current value indicating the battery current measured at the second time point; and
determining the threshold voltage value based on a reference resistance, an internal resistance of the battery and the diagnosis current value,
wherein the reference resistance is a sum of a first contact resistance between the first electrical conductor and the positive terminal and a second contact resistance between the second electrical conductor and the negative terminal when both the first electrical conductor and the second electrical conductor are fault-free,
wherein the threshold voltage value is determined using the following Equation 1:

$$\Delta V_{th} = \{|I_{dig}| \times (R_{node} = R_{int})\} \times \alpha, \quad (1)$$

and
wherein $I_{dig}$ denotes the diagnosis current value, $R_{node}$ denotes the reference resistance, $R_{int}$ denotes the internal resistance of the battery, a denotes a predetermined error ratio, and $\Delta V_{th}$ denotes the threshold voltage value.

10. The method according to claim 9, further comprising determining that at least one of the first electrical conductor and the second electrical conductor is faulty when an absolute value of the difference between the idle voltage value and the diagnosis voltage value is larger than a threshold voltage value.

11. The method according to claim 9, further comprising:
measuring; by a temperature sensor, a temperature of the battery; and determining the threshold voltage value further based on a temperature value of the battery measured by the temperature sensor at the second time point.

12. The method according to claim 11, further comprising:
obtaining a resistance change ratio corresponding to the temperature value from a data table in which a correlation between temperature and resistance change ratio is recorded, and
determining the threshold voltage value using the following Equation 2:

$$\Delta V_{th} = \{|I_{dig}| \times \{(R_{node} \times C_1) - R_{int}\}\} \times \alpha \qquad (2)$$

wherein $I_{dig}$ denotes the diagnosis current value, $R_{node}$ denotes the reference resistance, $R_{int}$ denotes the internal resistance of the battery, $C_1$ denotes the resistance change ratio, $\alpha$ denotes a predetermined error ratio, and $\Delta V_{th}$ denotes the threshold voltage value.

13. The method according to claim 9, further comprising determining the internal resistance of the battery based on a history of the battery current.

14. The method according to claim 9, further comprising outputting a fault message when at least one of the first electrical conductor and the second electrical conductor is determined to be faulty.

* * * * *